(12) United States Patent
Nakasato et al.

(10) Patent No.: US 7,915,737 B2
(45) Date of Patent: *Mar. 29, 2011

(54) PACKING BOARD FOR ELECTRONIC DEVICE, PACKING BOARD MANUFACTURING METHOD, SEMICONDUCTOR MODULE, SEMICONDUCTOR MODULE MANUFACTURING METHOD, AND MOBILE DEVICE

(75) Inventors: Mayumi Nakasato, Ogaki (JP); Yoshio Okayama, Gifu (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 60 days.

This patent is subject to a terminal disclaimer.

(21) Appl. No.: 11/957,030

(22) Filed: Dec. 14, 2007

(65) Prior Publication Data
US 2008/0157338 A1 Jul. 3, 2008

(30) Foreign Application Priority Data

Dec. 15, 2006 (JP) .................. 2006-337708
Dec. 20, 2006 (JP) .................. 2006-343036
Dec. 5, 2007 (JP) .................. 2007-314240
Dec. 5, 2007 (JP) .................. 2007-314241

(51) Int. Cl.
*H01L 23/48* (2006.01)
(52) U.S. Cl. ................ 257/775; 257/E23.011
(58) Field of Classification Search .......... 257/737, 257/738, 773, 774, 775
See application file for complete search history.

(56) References Cited

U.S. PATENT DOCUMENTS

| | | | |
|---|---|---|---|
| 6,492,255 B2 * | 12/2002 | Enomoto et al. | 438/614 |
| 6,808,962 B2 * | 10/2004 | Tsubosaki | 438/118 |
| 2003/0137056 A1 * | 7/2003 | Taniguchi et al. | 257/774 |
| 2005/0218480 A1 * | 10/2005 | Usui et al. | 257/632 |

FOREIGN PATENT DOCUMENTS

| | | |
|---|---|---|
| JP | 09-289264 | 11/1997 |
| JP | 11-298143 | 10/1999 |
| JP | 2001-144206 | 5/2001 |
| JP | 2005-286041 | 10/2005 |

* cited by examiner

*Primary Examiner* — Sue Purvis
*Assistant Examiner* — Benjamin P Sandvik
(74) *Attorney, Agent, or Firm* — Fish & Richardson P.C.

(57) ABSTRACT

A manufacturing technology is provided capable of improving the reliability of a semiconductor module having a via contact connected to an electrode part of a semiconductor component. The semiconductor module includes: a semiconductor component provided with an electrode part on a mounting surface; an insulating layer provided on the mounting surface of the semiconductor component; a wiring layer formed on the insulating layer; a first conductor part which is embedded in the insulating layer and which is in contact with the electrode part; and a second conductor part which is formed in an aperture provided in the insulating layer above the first conductor part and which electrically connects the first conductor part and the wiring layer.

5 Claims, 15 Drawing Sheets

PACKING BOARD FOR ELECTRONIC DEVICE, PACKING BOARD MANUFACTURING METHOD, SEMICONDUCTOR MODULE, SEMICONDUCTOR MODULE MANUFACTURING METHOD, AND MOBILE DEVICE

CROSS-REFERENCE TO RELATED APPLICATIONS

This application is based upon and claims the benefit of priority from the prior Japanese Patent Applications No. 2006-337708, filed Dec. 15, 2006, Japanese Patent Application No. 2006-343036 filed on Dec. 20, 2006, Japanese Patent Application No. 2007-314241, filed Dec. 5, 2007 and Japanese Patent Application No. 2007-314240, filed Dec. 5, 2007, the entire contents of which are incorporated herein by reference.

BACKGROUND OF THE INVENTION

1. Field of the Invention

The present invention relates to packing boards adapted to mount an electronic device, semiconductor modules and methods of manufacturing the same.

2. Description of the Related Art

Recently, with the trend toward miniaturization and high performance of electronic devices, there is a demand for reduction of the size of semiconductor devices used in electronic devices. To achieve this, narrow-gap electrodes for external connection for semiconductor devices are essential. However, efforts for size reduction by narrowing the gap between electrodes have been successful only to a limited degree due to the constraints imposed by the size of solder bumps and solder bridges produced. Recently, there are attempts to relocate the electrodes by rewiring lines in a semiconductor device in an effort to overcome the limitation. Generally, in rewiring a semiconductor device, an aperture for via contact is formed in an insulating resin layer provided on an electrode pad, for the purpose of leading outside a signal from a semiconductor device in a semiconductor module via the electrode pad. Since a semiconductor device is disposed below an electrode pad, the aperture need be formed without applying excessive heat. However, formation of an aperture on an electrode pad by laser irradiation, as is conventionally done, involves a disadvantage in that a semiconductor device is damaged via the electrode pad due to the heat from laser, and the reliability of the semiconductor device is lowered accordingly. One method proposed to address the issue is to produce an aperture by laser irradiation and subsequent dry etching on an insulating resin layer on an electrode pad. In the related-art method of forming an aperture, an aperture is formed to a depth that does not damage a semiconductor device and the aperture is then completed by subsequent dry etching.

While the above-mentioned method can mitigate the effect from the heat produced by laser irradiation, the electrode pad, which is exposed in the final stage of dry etching will be exposed to plasma atmosphere, thus applying charge-up damage to a semiconductor device (transistor or the like) connected to the pad. Therefore, there is a concern that the device characteristics may be impaired and the reliability of a semiconductor device may be reduced. As efforts toward microfabrication of an aperture for further miniaturization of a semiconductor module are promoted in the future, the completeness of coating by the via contact formed in the aperture would be lost, and the resultant reduction in the reliability of a semiconductor module would present a problem.

SUMMARY OF THE INVENTION

In this background, a general purpose of the present invention is to provide a manufacturing technology capable of improving the reliability of a semiconductor module having a via contact connected to an electrode part of a semiconductor device. An additional purpose of the present invention is to provide a semiconductor module having a via contact in which the reliability of connection with an electrode part of a semiconductor device is high.

An aspect of the present invention relates to a semiconductor module. The semiconductor module comprises: a semiconductor device provided with an electrode part on a mounting surface; an insulating layer provided on the mounting surface of the semiconductor device; a wiring layer formed on the insulating layer; a first conductor part which is embedded in the insulating layer and which is in contact with the electrode part; and a second conductor part which is formed in an aperture provided in the insulating layer above the first conductor part and which electrically connects the first conductor part and the wiring layer.

According to this aspect, the second conductor part is formed on the first conductor part embedded in the insulating layer. Therefore, the depth of the aperture is smaller than when the aperture is formed to be directly in contact with the electrode. For this reason, the completeness of coating by the second conductor formed in the aperture is promoted, and the reliability of connection between the first conductor part and the second conductor part is improved.

In the above aspect, the first conductor may be progressively smaller in diameter toward the surface of contact with the electrode part. Alternatively, the first conductor part may be progressively smaller in diameter toward the surface of contact with the second conductor part.

Another aspect of the present invention relates to a method of manufacturing a semiconductor module. The method of manufacturing a semiconductor module comprises: preparing a substrate having an electrode on its surface; forming a first conductor part on one surface of an insulating layer; embedding the first conductor in the insulating layer by pressure-bonding the insulating layer to the substrate while maintaining contact between the electrode and the first conductor part; forming an aperture so as to expose the first conductor part through the other surface of the insulating layer; and forming a second conductor part in the aperture.

According to this aspect, the aperture on which to form the second conductor part is formed on the first conductor part embedded in the insulating layer. Therefore, it is ensured that the depth of the aperture is smaller than when the aperture is formed to be directly in contact with the electrode. For this reason, the completeness of coating by the second conductor formed in the aperture is promoted, and the reliability of connection between the first conductor part and the second conductor part is improved. Further, time required to form the aperture is reduced so that the throughput in manufacturing the semiconductor module can be improved.

In the above aspect, it is favorable to form the first conductor part to have a side part which is progressively smaller in diameter toward a portion contiguous with the insulating layer. With this, the first conductor part can be smoothly embedded in the insulating layer 4 in the process of embedding the first conductor part in the insulating layer, maintaining contact with the electrode. This results in increased manufacturing throughput and cost reduction of semiconductor modules more reliable than conventional modules.

In the above aspect, it is favorable to include the step of pressure-bonding the insulating layer to the substrate while the insulating layer is partially hardened, and the step of heating the insulating layer to harden the layer. In this way, the first conductor part is allowed to embed itself in the insulating layer automatically and easily. Accordingly, the semiconductor module with improved reliability can be manufactured at a further reduced cost.

Still another aspect of the present invention relates to a mobile device. The mobile device carries one of the semiconductor modules described above.

It is to be noted that any arbitrary combination or rearrangement of the above-described structural components and so forth are all effective and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A description will now be given of the embodiments which embody the present invention. In the figures, like numerals represent like constituting elements, and the description thereof is omitted appropriately.

First Embodiment

Figure 1:
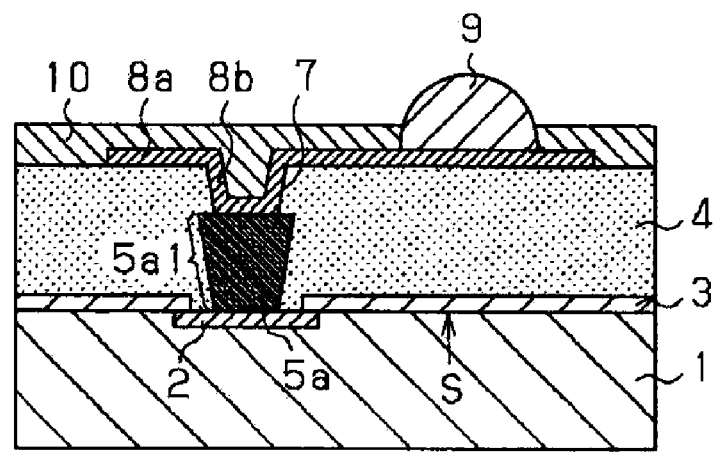
FIG. 1 is a schematic section showing the structure of a semiconductor module according to a first embodiment.

FIG. 1 is a schematic section showing the structure of a semiconductor module according to the first embodiment. A description will now be given of the semiconductor module according to the first embodiment with reference to FIG. 1.

A semiconductor substrate 1 is embodied by, for example, a p-type silicon substrate. A semiconductor device (not shown) is formed on the upper surface S (mounting surface) thereof by using a well-known technology. An electrode 2 for the semiconductor device is formed on the surface S (particularly, the periphery thereof). A protective film 3 is formed on at least a part of the surface of the semiconductor substrate 1 so as to expose a certain region of the electrode 2. In order to secure a large gap between the electrodes 2 on the surface S of the semiconductor substrate 1, an insulating layer 4 is formed on the electrode 2 and the protective film 3, and a rewiring pattern 8a is formed on the layer 4. Connection between the electrode 2 and the rewiring pattern 8a is established via a conductive bump 5a connected to the exposed surface of the electrode 2, and a via contact 8b connected to the conductive bump 5a. An electrode (solder bump) 9 for external connection is provided on a certain region of the rewiring pattern 8a. The other areas of the pattern 8a are covered by a solder resist layer 10. The semiconductor substrate 1 is an example of the "substrate" according to the invention, the electrode 2 is an example of the "electrode" according to the invention, the insulating layer 4 is an example of the "insulating layer" according to the invention, the conductive bump 5a is an example of the "first conductor" according to the invention, and the via contact 8b is an example of the "second conductor" according to the invention.

More specifically, the insulating layer 4 is formed on the surface (upper surface) of the semiconductor substrate 1 and has a thickness of about 80 μm. The insulating layer 4 is formed of a material that undergoes plastic flow when applied pressure. Epoxy thermosetting resin will be mentioned as a material that undergoes plastic flow when applied pressure, by way of example. For example, epoxy thermosetting resin used for the insulating layer 4 may be a material exhibiting the viscosity of 1 kPa/s at the temperature of 160° C. and the pressure of 8 MPa. If the material is pressed at 15 MPa under the temperature of 160° C., the viscosity of the resin will drop to ⅛ the level exhibited when the resin is not pressured. Below the glass-transition temperature Tg, epoxy resin in the B stage prior to thermosetting exhibits low viscosity of the level exhibited when the resin is not pressured, and does not exhibit viscosity even when pressured. Epoxy thermosetting resin may be formed into a film of a type in which a woven glass fiber is impregnated with resin. Alternatively, a filler having a particle diameter of about 2-10 μm may be introduced in the film of the insulating layer. The filler may be alumina ($Al_2O_3$), silica ($SiO_2$), aluminum nitride (AlN), silicon nitride (SiN) or boron nitride (BN). The filler is present at 30-80% by weight.

The conductive bump 5a comprises a metal such as copper (Cu) and embedded in the insulating layer 4 so as to be in contact with the exposed surface of the electrode 2. The height of the conductive bump 5a is about 50 μm. The conductive bump 5a is formed as a truncated cone having a trapezoidal cross section, and is provided with an end part parallel with the contact surface of the electrode 2 of the semiconductor substrate 1, and with a side part 5a1 formed to be progressively smaller in diameter (dimension) toward the end part. The diameter of the conductive bump 5a at the end part and the diameter at the base are about 80 μmφ and about 100 μmφ, respectively. The conductive bump 5a is positioned in association with the electrode 2. The end part of the conductive bump 5a is formed so as to be in direct contact with the electrode 2 of the semiconductor substrate 1.

The rewiring pattern 8a is formed on the insulating layer 4 and has a thickness of about 20 μm. The rewiring pattern 8a comprises, for example, a metal such as copper (Cu), and is electrically connected to the conductive bump 5a via the via contact 8b provided in an aperture 7 of the insulating layer 4. The via contact 8b is provided to coat the interior surface of the aperture 7 having a width of about 100 μm, and is formed to be integral with the rewiring pattern 8a. Since the conductive bump 5a is interposed on the electrode 2, the depth of the via contact 8b (aperture 7) is about 30 μm, which is smaller than when the via contact (aperture) is formed directly on the electrode 2.

As described, according to the first embodiment of the present invention, signals from a semiconductor module are led outside by forming the routing pattern 8a for the electrode 2 of the semiconductor substrate 1 via the conductive bump 5a and the via contact 8b.

(Manufacturing Method)

FIGS. 2A-2D are schematic sections illustrating a method of forming an insulating layer provided with a conductive bump according to the first embodiment. FIGS. 3A-3E are schematic sections illustrating a process of manufacturing the semiconductor module according to the first embodiment. A description will now be given of a process of manufacturing a semiconductor module according to the first embodiment, by referring to FIGS. 1-3E.

Figure 2A:
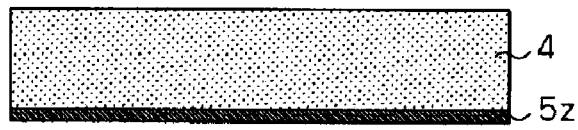
FIGS. 2A-2D are schematic sections illustrating a method of forming an insulating layer provided with a conductive bump according to the first embodiment.

As shown in FIG. 2A, a copper foil 5z having a thickness of about 3 μm is formed on the insulating layer 4 comprising epoxy thermosetting resin and having a thickness of about 80 μm.

Figure 2B:
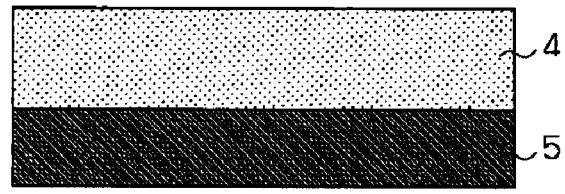

As shown in FIG. 2B, the surface of the copper foil 5z is plated with copper by electroless plating and electroplating. With this, a copper layer 5 having a thickness of about 50 μm is formed on the insulating layer 4.

Figure 2C:
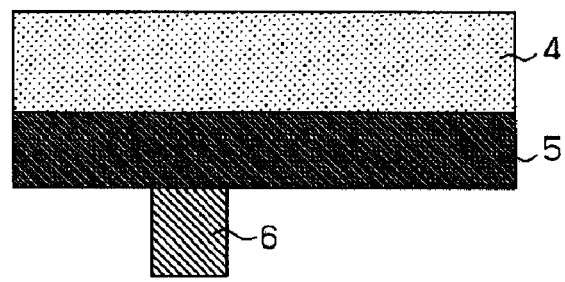
Figure 2C:
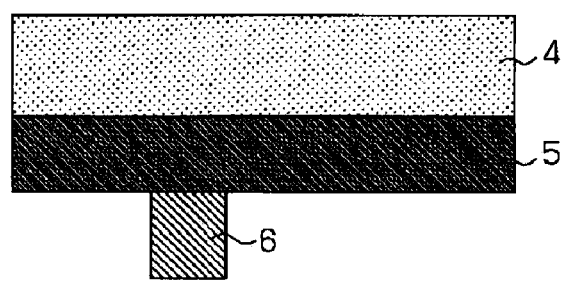

As shown in FIG. 2C, ordinary lithographic steps are employed to form a resist mask 6 where the conductive bump is formed on the copper layer 5. The conductive bump is formed in association with the position of the electrode 2 of the semiconductor substrate 1 shown in FIG. 1.

Figure 2D:
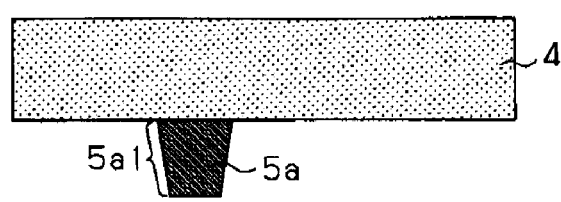

As shown in FIG. 2D, wet etching using a chemical solution is performed by using the resist mask 6 as a mask, so as to form the conductive bump 5a having a predetermined truncated cone pattern. The conductive bump 5a is formed to have a side part 5a1 which is progressively smaller in diameter (dimension) toward the end part. The height of the conductive bump 5a is about 50 μm. The diameter of the conductive bump 5a at the end part and the diameter at the base are about 80 μmφ and about 100 μmφ, respectively. The resist mask 6 is then removed. In the steps described above, it is ensured that the insulating layer 4 is not heated to a thermosetting temperature in order not to completely thermoset the layer 4. The layer 4 is maintained in a partially hardened state (fluid state).

A composite of the insulating layer 4 and the conductive bump 5a thus manufactured is used in the process described below of manufacturing the semiconductor module according to the first embodiment.

Figure 3A:
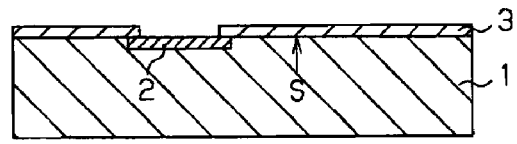
FIGS. 3A-3E are schematic sections illustrating a process of manufacturing the semiconductor module according to the first embodiment.

As shown in FIG. 3A, a well-known technology is used to form a semiconductor device (not shown) on the upper surface S of the semiconductor substrate 1 embodied by, for example, a p-type silicon substrate, and to form the electrode 2 around or above the semiconductor device. Generally, a metal such as aluminum is used to form the electrode 2. An insulating protective film 3 for protecting the semiconductor substrate 1 is formed on at least a part of the surface S of the semiconductor substrate 1 so as to expose a certain region of the electrode 2. The protective film 3 may comprise a silicon oxide ($SiO_2$) film or a silicon nitride (SiN) film.

Figure 3B:
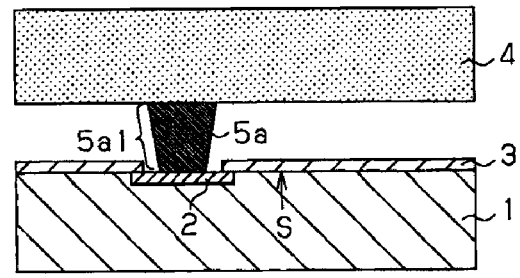

As shown in FIG. 3B, the end part of the conductive bump 5a is brought into contact with the surface of the electrode 2 of the semiconductor substrate 1. The composite of the conductive bump 5a and the insulating layer 4 is formed as described above.

Figure 3C:
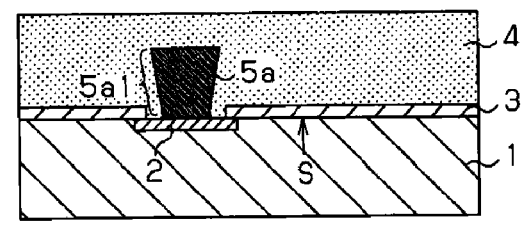

As shown in FIG. 3C, the semiconductor substrate 1, the conductive bump 5a and the insulating layer 4 are integrated by pressure molding the assembly as described above using a press machine (press-fitting step). The pressure and the temperature of the press work are about 5 MPa and 200° C., respectively. The press work lowers the viscosity of the insulating layer 4 so that the insulating layer 4 undergoes plastic flow. This results in the conductive bump 5a embedding itself in the insulating layer 4, maintaining contact with the electrode 2. Since the thickness of the insulating layer 4 is about 80 μm, and the height of the conductive bump is about 50 μm, the conductive bump 5a is embedded in such a manner that the bump 5a does not penetrate the layer 4 in the process of pressure molding.

Subsequently, the insulating layer 4 is completely hardened by subjecting the insulating layer 4 to heat treatment (150° C., 30 minutes) (hardening step). As a result, the insulating layer 4 is pressure-bonded to the semiconductor substrate 1, and the conductive bump 5a is anchored in the insulating layer 4, maintaining contact with the electrode 2.

Figure 3D:
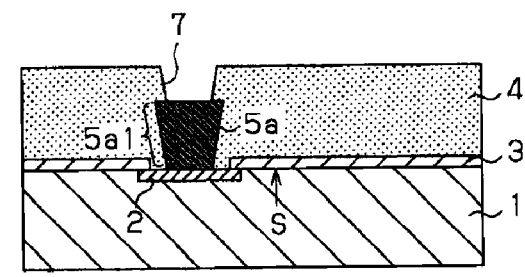
Figure 3E:
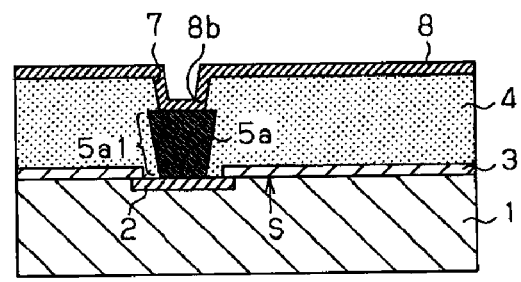

As shown in FIG. 3D, the aperture 7 is formed so as to expose the conductive bump 5a by irradiating the insulating layer 4 from above. For laser irradiation, $CO_2$ gas laser may be employed. Irradiation is performed in a first condition and then in a second condition in which the pulse width is modified. A laser with a pulse period of 0.25 ms and an output of 1.0 W is used. The first condition may be such that the pulse width is 8-10 μs and the number of shots is 1. The second condition may be such that the pulse width is 3-5 μs, the pulse interval is 25 ms or longer, and the number of shots is 3. By irradiation, the aperture 7 having a tapered side wall with a progressively smaller diameter toward the conductive bump 5a and away from the surface of the insulating layer 4 is formed.

Subsequently, the upper surface of the insulating layer 4 and the interior surface of the aperture 7 are plated with copper by electroless plating and electroplating to a thickness of about 20 μm. As a result, a copper plating layer 8 having a thickness of about 20 μm is formed on the insulating layer 4, and the via contact 8b is formed to coat the interior wall of the aperture 7.

Finally, lithography and etching are performed as normally so as to work the copper plating layer 8 into the rewiring pattern 8a of FIG. 1 with lines and spaces. The solder resist layer 10 is formed so as to cover the rewiring pattern 8a and the insulating layer 4 on the semiconductor substrate 1, and to have an opening where an electrode pad for the rewiring pattern 8a is formed. The solder resist layer 10 functions as a protective film for the rewiring pattern 8a. The solder resist layer 10 comprises epoxy resin and has a thickness of about 40 μm. Solder printing is used to form an electrode for external connection (solder ball) 9 which functions as a terminal for the rewiring pattern 8a exposed through the opening of the solder resist layer 10.

Through these steps, the semiconductor module of FIG. 1 according to the first embodiment is manufactured.

According to the semiconductor module of the first embodiment and the method of manufacturing the same, the following advantages are provided.

(1) By forming the conductive bump 5a on the electrode 2 of the semiconductor substrate 1, then forming the aperture 7 by laser irradiation, and then forming a via contact part (comprising the conductive bump 5a and the via contact 8b) by forming the via contact 8b inside the aperture 7, the via contact part can be formed on the electrode 2 without employing dry etching. Thus, unlike the related art, charge-up damage caused by dry etching is prevented from being applied to the semiconductor substrate via the electrode. Thus, the reliability of the semiconductor module is maintained more successfully. Further, given the same depth of the via contact part, time required to form the aperture 7 by laser irradiation is reduced by interposing the conductive bump 5a. Therefore, adverse effects from heat caused by laser irradiation are mitigated. Consequently, high stability of manufacturing (reliability) the semiconductor module, having the via contact part (the conductive bump 5a and the via contact 8b) connected to the electrode 2 of the semiconductor substrate 1, is ensured.

(2) By forming the via contact 8b on the conductive bump 5a, the depth of the aperture is reduced as compared to a case where the via contact part is directly connected to the electrode 2, given that the depth of the via contact part is the same. Therefore, time required for laser irradiation for forming the aperture (time to form the aperture) is reduced so that the throughput of semiconductor module manufacturing is improved.

(3) By forming the via contact 8b on the conductive bump 5a, the depth of the aperture is reduced as compared to a case where the via contact part is directly connected to the electrode 2, given that the depth of the via contact part is the same. Therefore, the completeness of coating by the copper plating layer 8 (via contact 8b) formed in the aperture is promoted, and the reliability of connection of the via contact part (the conductive bump 5a and the via contact 8b) is improved.

(4) By forming the via contact 8b on the conductive bump 5a, the depth of the aperture is reduced as compared to a case where the via contact part is directly connected to the electrode 2, given that the depth of the via contact part is the same. Therefore, the aspect ratio of the aperture is reduced. Therefore, variation in modules manufactured caused by the depth of the aperture formed is reduced so that a semiconductor module with improved reliability can be manufactured easily without introducing any high-performance apparatuses for formation of an aperture. Additionally, the cost of manufacturing a semiconductor module is reduced.

(5) By forming the via contact 8b on the conductive bump 5a, the depth of the aperture is reduced as compared to a case where the via contact part is directly connected to the electrode 2, given that the depth of the via contact part is the same. Given the same angle of tapering and the same bottom dimension (area) of the aperture 7 as shown in FIG. 1 with a tapered side wall, growth of the dimension of the aperture due to the tapered form is less pronounced as the depth of the aperture is small. Thus, it is ensured that the dimension of the aperture toward the surface of the insulating layer 4 is smaller than when forming an aperture that reaches the electrode 2. Further, the conductive bump 5a can be formed to a size smaller than the resolution limit in lithography, by over-etching the copper layer 5. As a result of this, the size of a semiconductor module, having the via contact part with a laminate of the bump and the contact, is reduced.

(6) By embedding the conductive bump 5a in the insulating layer 4 by pressure-bonding, the conductive bump 5a can be formed on the electrode 2 such that the semiconductor substrate 1 is not affected via the electrode 2 by damage due to laser irradiation or dry etching than when forming a part corresponding to the conductive bump by laser irradiation or dry etching.

Second Embodiment

Figure 4:
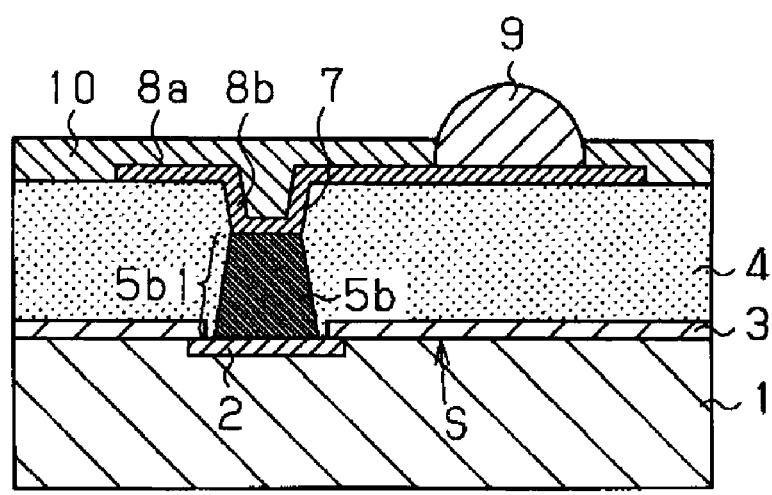
FIG. 4 is a schematic section showing the structure of a semiconductor module according to a second embodiment.

FIG. 4 is a schematic section showing the structure of a semiconductor module according to the second embodiment. A difference from the first embodiment is that a conductive bump 5b is formed to have a side part 5b1 which is progressively smaller in diameter (dimension) toward the via contact 8b and away from the electrode 2, i.e., the side part 5b1 which is progressively larger in diameter (dimension) toward the electrode 2 and away from the via contact 8b. The other aspects of the second embodiment are the same as the corresponding aspects of the first embodiment.

More specifically, the conductive bump 5b comprises a metal such as copper (Cu) and embedded in the insulating layer 4 so as to be in contact with the exposed surface of the electrode 2. The height of the conductive bump 5b is about 50 μm. The conductive bump 5b is formed as an inverted truncated cone having an inverted trapezoidal cross section, and is provided with an end part parallel with the contact surface of the electrode 2 of the semiconductor substrate 1, and with a side part 5b1 formed to be progressively smaller in diameter (dimension) toward the via contact 8b and away from the end part. The diameter of the conductive bump 5b at the end part and the diameter at the base are about 100 μmφ and 80 μmφ, respectively. The conductive bump 5b is positioned in association with the electrode 2. The end part of the conductive bump 5b is formed so as to be in direct contact with the electrode 2 of the semiconductor substrate 1.

(Manufacturing Method)

FIGS. 5A-5E are schematic sections illustrating a method of forming an insulating layer provided with a conductive bump according to the second embodiment. FIGS. 6A-6B are schematic sections illustrating a process of manufacturing the semiconductor module according to the second embodiment.

Figure 5A:
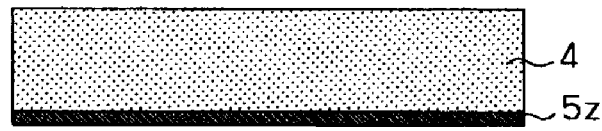
FIGS. 5A-5E are schematic sections illustrating a method of forming an insulating layer provided with a conductive bump according to the second embodiment.
Figure 6A:
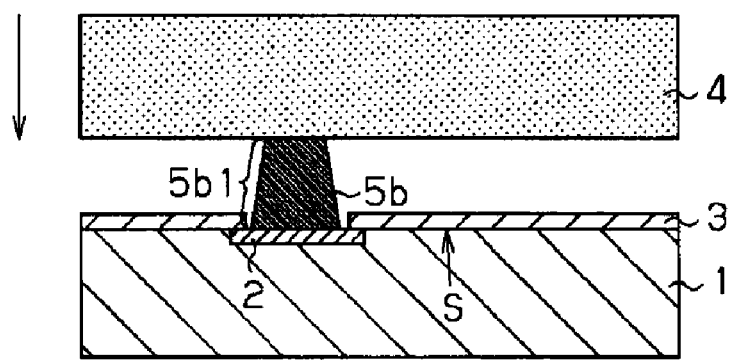
FIGS. 6A-6B are schematic sections illustrating a process of manufacturing the semiconductor module according to the second embodiment.
Figure 6B:
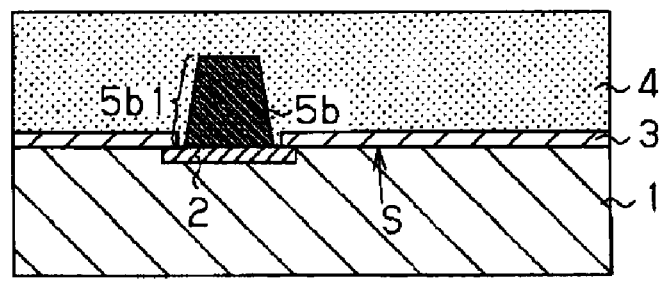

As shown in FIG. 5A, a copper foil 5z having a thickness of about 3 μm is formed on the insulating layer 4 comprising epoxy thermosetting resin and having a thickness of about 80 μm.

Figure 5B:
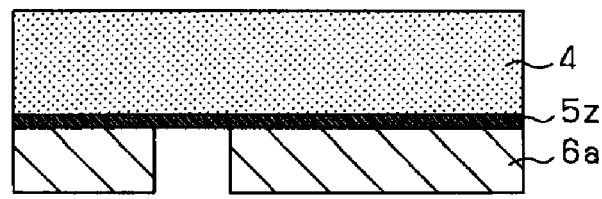

As shown in FIG. 5B, ordinary lithographic steps are employed to form a resist mask 6a where the conductive bump is formed on the copper foil 5z. The conductive bump is formed in association with the position of the electrode 2 of the semiconductor substrate 1 shown in FIG. 4.

Figure 5C:
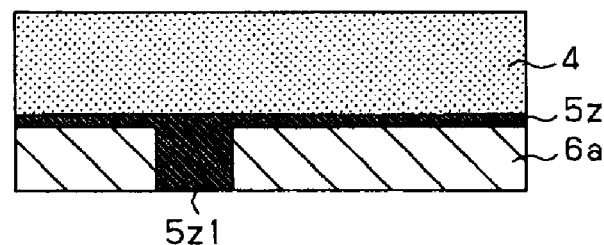

As shown in FIG. 5C, the surface of the copper foil 5z exposed through the aperture of the resist mask 6a is plated with copper by electroplating. With this, a copper plating layer 5z1 having a thickness of about 50 μm is formed on the insulating layer 4.

Figure 5D:
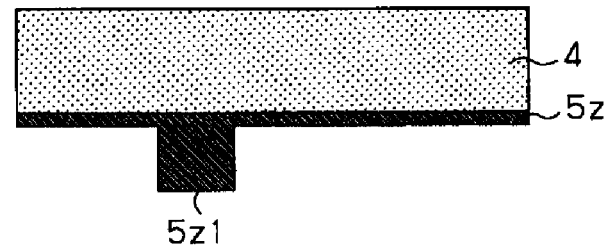

As shown in FIG. 5D, the resist mask 6a is removed. With this, the copper plating layer 5z1 serving as the conductive bump is formed on the copper foil 5z.

Figure 5E:
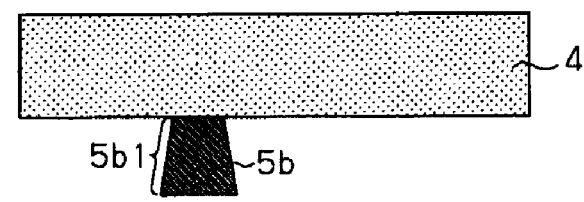

As shown in FIG. 5E, blanket etch-back is performed using a chemical solution so as to remove the copper foil 5z outside an area where the conductive bump is formed (outside the copper plating layer 5z1). In this process, the conductive bump 5b is formed to have a side part 5b1 which is progressively smaller in diameter (dimension) toward a portion contiguous with the insulating layer 4. The height of the conductive bump 5b is about 50 μm. The diameter of the conductive bump 5b at the end part and the diameter at the base are about 100 μmφ and about 80 μmφ, respectively. In the steps described above, it is ensured that the insulating layer 4 is not heated to a thermosetting temperature in order not to completely thermoset the layer 4. The layer 4 is maintained in a partially hardened state (fluid state).

A composite of the insulating layer 4 and the conductive bump 5b thus manufactured is used in the process described below of manufacturing the semiconductor module according to the second embodiment.

As shown in FIG. 6A, the semiconductor substrate 1 provided with the electrode 2 on its surface is prepared, and the insulating layer 4 with the conductive bump 5b is placed on the electrode 2 so that the end part of the conductive bump 5b is brought into contact with the electrode 2. The composite of the conductive bump 5a and the insulating layer 4 is formed as described above.

As shown in FIG. 6B, the semiconductor substrate 1, the conductive bump 5b and the insulating layer 4 are integrated by pressure molding the assembly as described above using a press machine. The pressure and the temperature of the press work are as described in the first embodiment. This results in the conductive bump 5b being embedded in the insulating layer 4, maintaining contact with the electrode 2. Since the conductive bump 5b has the side part 5b1 formed to be progressively smaller in diameter (dimension) toward a portion contiguous with the insulating layer 4, the conductive bump 5b can be smoothly embedded in the insulating layer 4 in the process of pressure-bonding.

The semiconductor module according to the second embodiment is manufactured through the steps described with reference to FIGS. 3C, 3D and 1 referred to in the first embodiment.

According to the semiconductor module and the method of manufacturing the same of the second embodiment, the following advantages are provided.

(7) By forming the conductive bump 5b to have the side part 5b1 which is progressively smaller in diameter (dimension) toward a portion contiguous with the insulating layer 4, the conductive bump 5b can be embedded smoothly in the insulating layer 4 in pressure-bonding. This results in increased manufacturing throughput and cost reduction of semiconductor modules with improved manufacturing stability (reliability).

In the first embodiment, the conductive bump 5a formed as a truncated cone (having a trapezoidal cross section) and having the side part 5a1 with a predetermined angle of tapering is used by way of example. Alternatively, the conductive bump may be of cylindrical shape having a predetermined diameter. While the round conductive bump with a truncated cone shape is used in the embodiment, the bump may have a polygonal (e.g. square) shape. The advantages (1)-(6) will be enjoyed with these forms equally.

In the first embodiment, the conductive bump 5a having the side part 5a1 with a predetermined angle of tapering and having a trapezoidal cross section is given by way of example. Alternatively, the end part of a square-shaped conductive bump 5a may be chamfered so that only a part of the side part is tapered. Similarly, only the end part may be rounded.

In the embodiments, the via contact 8b is provided to coat the aperture 7. Alternatively, the via contact 8b may be formed so as to completely fill the aperture 7 with copper plating, by ensuring that the aperture size of the aperture 7 is small, and an inhibitor and an accelerator are added in the plating solution while forming the routing patter 8a, which includes the via contact 8b. In this case, the resistance of the via contact can be lowered.

In the above-described embodiments, the via contact part (the conductive bumps 5a and 5b, and the via contact 8b) connecting the electrode 2 of the semiconductor substrate 1 to the rewiring pattern 8a is provided. Alternatively, the inventive approach may be applied to a via contact part for connecting a lower interconnect and an upper interconnect in a multi-layer board. With this, the multi-layer board can be manufactured in a highly stable manner and at a reduced cost.

Third Embodiment

Recently, with the miniaturization and high performance of electronic appliances, there is a demand for reduction of the size of semiconductor modules used in electronic appliances. To achieve this, narrow-gap electrodes for external connection of semiconductor modules are essential. However, efforts for size reduction by narrowing the gap between electrodes have been successful only to a limited degree due to the constraints imposed by the size of solder bumps and solder bridges produced. Recently, there are attempts to relocate the electrodes by routing lines in a semiconductor module in an effort to overcome the limitation. For relocation, a metal plate may be half-etched so that a resultant projection is used as an electrode or a via, a semiconductor module may be mounted on the metal plate via an insulating layer of, for example, epoxy resin, and the electrode for external connection for the semiconductor module may be connected to the projection.

For improvement of reliability of connection with the metal plate projection in a semiconductor module, there is proposed a method whereby an adhesive layer such as a soft metal coat (e.g., a gold coat) or a conductive adhesive (e.g., solder paste) is provided at the end of the projection and connection with the projection is established via the adhesive layer.

However, since copper (Cu) is generally used to form an electrode for external connection for a semiconductor module or a for metal plate having a projection, thermal stress caused by a difference in coefficient of thermal expansion between materials develops at an interface between the electrode and the adhesive layer (or an interface between the projection and the adhesive layer) in association with, for example, variation in temperature induced by a thermal process. As efforts toward microfabrication of a projection itself are promoted for further miniaturization of a semiconductor module, the area of contact between the electrode and the adhesive layer (or the area of contact between the projection and the adhesive layer) will be reduced. Thus, there is a concern that disconnection may occur due to thermal stress at an interface between the electrode and the adhesive layer (or an interface between the projection and the adhesive layer).

In this background, a general purpose of the present invention is to provide a technology to improve the reliability of connection in an electrode of a packaging board or a semiconductor module.

An aspect of this embodiment relates to a packaging board adapted to mount an electronic device. The packaging board comprises: a first wiring layer; an insulating layer provided on the first wiring layer and containing a fibrous filler inside; a second wiring layer provided on the insulating layer; and a via conductor penetrating the insulating layer and electrically connecting the first wiring layer and the second wiring layer, wherein the via conductor is provided with a first conductor part provided to be in contact with the first wiring layer and a second conductor part provided on the first conductor part, and the fibrous filler is located on the surface of the first conductor part on which the second conductor is provided. The fibrous filler is suitably glass fiber because of its heat release capability and rigidity. The filler is included in the insulating layer in the form of a felt or a cloth.

According to this aspect, the likelihood of disconnection at the interface between the first wiring layer and the via conductor (particularly, the first conductor part) due to temperature change is reduced, and a packaging board is provided in which the reliability of connection (thermal reliability) between the first wiring layer and the via conductor is improved. This is due to the fact that, by providing the fibrous filler on the upper surface of the first conductor part constituting the via conductor, the fibrous filler operates to restrict the movement of the first conductor part even when the via conductor is stressed in the direction of peeling (vertical direction) so that the likelihood of peeling at the interface with the first wiring layer is reduced. With this, peeling does not occur between the first wiring layer and the first conductor part even when a temperature change occurs in the packaging board, so that bad connection between the first wiring layer and the via conductor can be prevented.

Above the via conductor according to the aspect, the fibrous filler is preferably deformed into a convex shape projecting toward the second wiring layer with reference to the surrounding area. With this, the fibrous filler formed into a convex shape operates to prevent the displacement of the conductive bump when shear stress is developed between the first wiring layer and the via conductor (particularly, the first conductor part). Accordingly, the reliability of connection between the first wiring layer and the via conductor is further improved.

In the above aspect, the part of the first conductor part in contact with the first wiring layer may be formed into an inverted mesa structure. With this structure, the anchor effect on the first conductor part further restricts the vertical movement of the via conductor, thereby improving the closeness of contact between the first wiring layer and the via conductor. Thereby, the connection reliability (thermal reliability) of the packaging board in the presence of thermal stress is further improved.

Another aspect of this embodiment relates to a semiconductor module. The semiconductor module is provided with a packaging board according to at least one of the aspects described above and a semiconductor device mounted on the packaging board.

Still another aspect of this embodiment relates to a mobile device. The mobile device is provided with the semiconductor module described above.

Yet another aspect of this embodiment relates to a method of manufacturing a packaging board. The method of manufacturing a packaging board comprises: preparing a substrate having a first wiring layer on its surface; forming a first conductor part on one surface of an insulating layer containing a fibrous filler inside; embedding the first conductor part in the insulating layer by pressure-bonding the insulating layer to the substrate while maintaining contact between the first wiring layer and the first conductor part; pressing the first conductor part to the fibrous filler; forming an aperture so as to expose the first conductor part through the other surface of the insulating layer; and forming a second conductor part in the aperture and forming a second wiring layer connected to the second conductor part.

According to this aspect, the likelihood of disconnection at the interface between the first wiring layer and the first conductor part due to temperature change is reduced, and a packaging board, in which the connection reliability (thermal reliability) of the via conductor (the first conductor part and the second conductor part) is improved, can be manufactured. In the process of pressure-bonding the insulating layer to the substrate, the packaging board, in which the fibrous filler is provided on the upper surface (the surface in contact with the second conductor) of the first conductor part, is automatically formed by allowing the first conductor part to embed itself in the insulating layer. Accordingly, the steps of manufacturing the packaging board are simplified. Therefore, a packaging board with improved connection reliability (reliability of connection between the first wiring layer and the first conductor part) in the presence of thermal stress can be manufactured at a reduced cost.

In the fourth step, the aperture is preferably formed by laser irradiation. $CO_2$ laser is suitably used for laser irradiation. According to this structure, by forming the first conductor part on the first wiring layer and then working the aperture by laser irradiation so as to form the second conductor inside, the charge-up damage caused by dry etching is prevented from being applied to the substrate via the first wiring layer, as compared with a case where the aperture is formed by dry etching. Accordingly, the reliability of the packaging board is prevented from being lowered. Further, given the same depth of the via conductor, time required to form the aperture (the aperture provided in association with the second conductor part) by laser irradiation is reduced by interposing the first conductor part underneath the second conductor part. Therefore, adverse effects from heat caused by laser irradiation (damage by heat to the semiconductor device and associated lowering of the reliability of the semiconductor device) are mitigated. Consequently, high stability in manufacturing (reliability) of the packaging board, having the via conductor (the first conductor part and the second conductor part) connected to the first wiring layer, is ensured.

In the above aspect, it is favorable to form the first conductor part to have a tapered side part which is progressively smaller in diameter toward a portion contiguous with the insulating layer. With this, the first conductor part can be smoothly embedded in the insulating layer in the process of embedding the first conductor part in the insulating layer, maintaining contact with the first wiring layer. This results in increased manufacturing throughput and cost reduction of packaging boards with improved manufacturing stability (reliability).

A description will now be given of exemplary embodiments implementing the third embodiment with reference to the drawings. In the figures, like numerals represent like constituting elements, and the description thereof is omitted appropriately.

First Exemplary Embodiment

Figure 7:
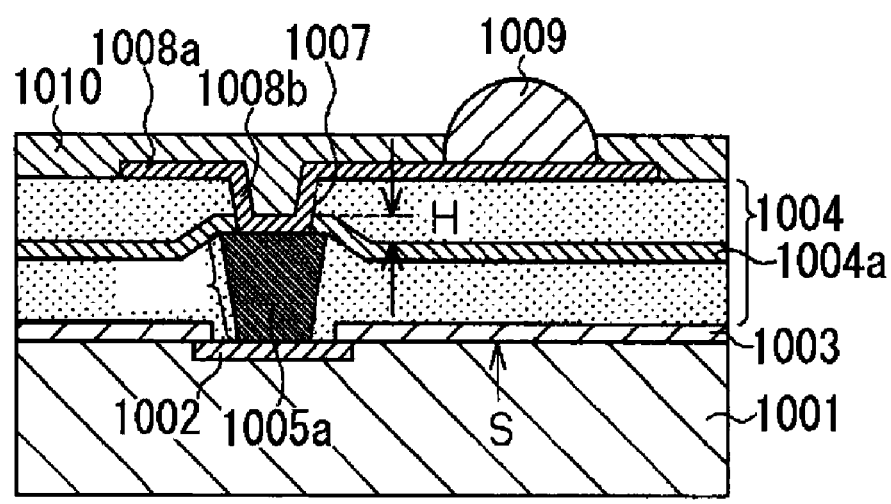
FIG. 7 is a schematic section showing the structure of a packing board and a semiconductor module according to the first exemplary embodiment.

FIG. 7 is a schematic section showing the structure of a packaging board and a semiconductor module according to a first exemplary embodiment of the third embodiment. A description will now be given of the packaging board and the semiconductor module according to the first embodiment with reference to FIG. 7.

A semiconductor substrate 1001 is embodied by, for example, a p-type silicon substrate. A semiconductor device (not shown) is formed on the upper surface S (mounting surface) thereof by using a well-known technology. An electrode 1002 for the semiconductor device is formed on the surface S (particularly, the periphery thereof). Generally, a metal such as aluminum is used to form the electrode 1002. A protective film 1003 is formed on at least a part of the surface of the semiconductor substrate 1001 so as to expose a certain region of the electrode 1002. In order to secure a large gap between the electrodes 1002 on the surface S of the semiconductor substrate 1, an insulating layer 1004 containing glass fiber 1004a is formed on the electrode 1002 and the protective film 1003, and a rewiring pattern 1008a is formed on the layer 1004. Connection between the electrode 1002 and the rewiring pattern 1008a is established via a conductive bump 1005a connected to the exposed surface of the electrode 1002, and a via contact part comprising a via contact 1008b connected to the conductive bump 1005a. The upper surface (the surface in contact with the via contact 1008b) of the conductive bump 1005a is coated with the glass fiber 1004a in the insulating layer 1004. The via contact 1008b is formed to penetrate the insulating layer 1004 containing the glass fiber 1004a. An electrode (solder bump) 1009 for external connection is provided on a certain region of the rewiring pattern 1008a. The other areas of the pattern 1008a are covered by a solder resist layer 1010. The semiconductor substrate 1001 is an example of the "substrate" according to the third embodiment, the electrode 1002 is an example of the "first wiring layer" according to the third embodiment, the insulating layer 1004 is an example of the "insulating layer" according to the third embodiment, the glass fiber 1004a is an example of the "fibrous filler" according to the third embodiment, the conductive bump 1005a is an example of the "first conductor part" according to the third embodiment, the via contact part comprising the conductive bump 1005a and the via contact 1008b is an example of the "via conductor" according to the third embodiment, and the rewiring pattern is an example of the "second wiring layer" according to the third embodiment.

More specifically, the insulating layer 1004 containing the glass fiber 1004a is a film of a type formed by woven glass fiber (e.g., glass fiber including an intersection of fibers extending horizontally with respect to the drawing, and fibers extending in a perpendicular direction) impregnated with resin. The insulating layer 1004 is formed on the surface S (upper surface) of the semiconductor substrate 1001 to have a thickness of about 100 μm. Vertically, the glass fiber 1004a is disposed at the center of the insulating layer 1004 with a thickness of about 20 μm. The insulating layer 1004 is formed of a material that undergoes plastic flow when applied pressure. Epoxy thermosetting resin will be mentioned as a material that undergoes plastic flow when applied pressure, by way of example. For example, epoxy thermosetting resin used for the insulating layer 1004 may be a material exhibiting the viscosity of 1 kPa/s at the temperature of 160° C. and the pressure of 8 MPa. If the material is pressed at 15 MPa under the temperature of 160° C., the viscosity of the resin will drop to ⅛ the level exhibited when the resin is not pressured.

A metal such as copper (Cu) is used to form the conductive bump 1005a. The conductive bump 1005a is positioned in association with the electrode 1002 and is embedded in the insulating layer 1004 while being in direct contact with the exposed surface of the electrode 1002. The glass fiber 1004a is formed to cover the upper surface (the surface in contact with the via contact 1008b) of the conductive bump 1005a. The height of the conductive bump 1005a is about 50 μm. The conductive bump 1005a is formed as a truncated cone having a trapezoidal cross section, and is provided with an end part parallel with the contact surface of the electrode 1002 of the semiconductor substrate 1001, and with a side part 1005a1 formed to be progressively smaller in diameter (dimension) toward the end part. The diameter of the conductive bump 1005a at the end part and the diameter at the base are about 80 μmφ and 100 μmφ, respectively. Above the conductive bump 1005a, the glass fiber 1004a is deformed into a convex shape projecting toward the rewiring pattern 1008a with reference to the surrounding area. The height (H) of the convex shape is about 10 μm.

The rewiring pattern 1008a is formed on the insulating layer 1004 and has a thickness of about 20 μm. The rewiring pattern 1008a comprises, for example, a metal such as copper (Cu), and is electrically connected to the conductive bump 1005a via the via contact 1008b provided in an aperture 1007 of the insulating layer 1004. The via contact 1008b is provided to coat the interior surface of the aperture 1007 having a width of about 100 μm, and is formed to be integral with the rewiring pattern 1008a. Since the conductive bump 1005a is interposed on the electrode 1002, the depth of the via contact 1008b (aperture 1007) is about 30 μm, which is smaller than when the via contact (aperture) is formed directed on the electrode 1002.

As described, according to the first exemplary embodiment of this embodiment, the electrode 1002 is relocated by forming the rewiring pattern 1008a above the electrode 1002 of the semiconductor substrate 1001 via the conductive bump 1005a and the via contact 1008b so that signals from a semiconductor module are led outside.

(Manufacturing Method)

FIGS. 8A-8D are schematic sections illustrating a method of forming an insulating layer provided with a conductive bump according to the first exemplary embodiment. FIGS. 9A-9E are schematic sections illustrating a process of manufacturing a packaging board and a semiconductor module according to the first exemplary embodiment. A description will now be given of a process of manufacturing a packaging board and a semiconductor module according to the first exemplary embodiment, by referring to FIGS. 7-9E.

Figure 8A:
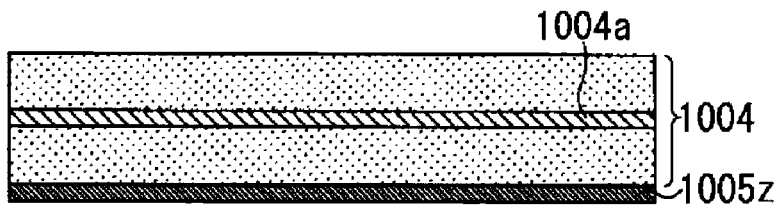
FIGS. 8A-8D are schematic sections illustrating a method of forming an insulating layer provided with a conductive bump according to the first exemplary embodiment.

As shown in FIG. 8A, a copper foil 1005z having a thickness of about 3 μm is formed on the insulating layer 1004 which includes the glass fiber 1004a having a thickness of about 20 μm, comprises epoxy thermosetting resin, and has a thickness of about 100 μm.

Figure 8B:
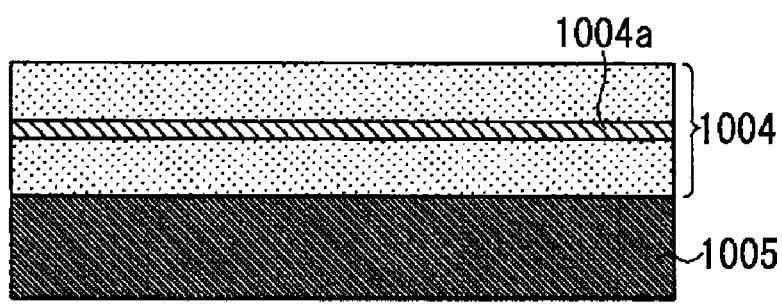

As shown in FIG. 8B, the surface of the copper foil 1005z is plated with copper by electroless plating and electroplating. With this, a copper layer 1005 having a thickness of about 50 μm is formed on the insulating layer 1004. The copper layer 1005 may comprise a rolled metal comprising rolled copper and having a thickness of about 50 μm, and may be formed on the insulating layer 1004 including the glass fiber 1004a.

Figure 8C:
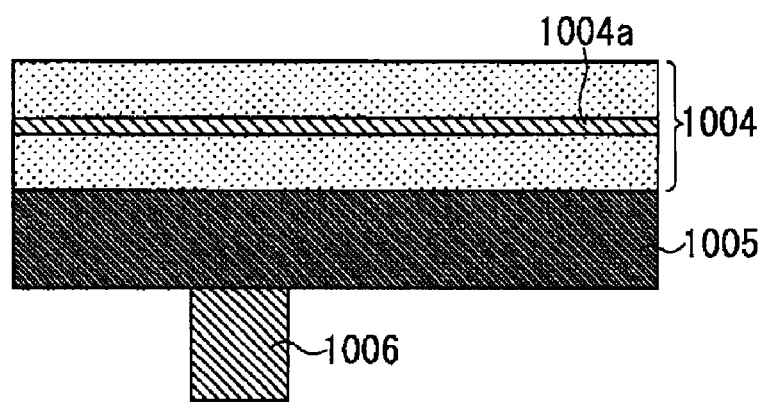

As shown in FIG. 8C, ordinary lithographic steps are employed to form a resist mask 1006 where the conductive bump is formed on the copper layer 1005. The conductive bump is formed in association with the position of the electrode 1002 of the semiconductor substrate 1001 shown in FIG. 7.

Figure 8D:
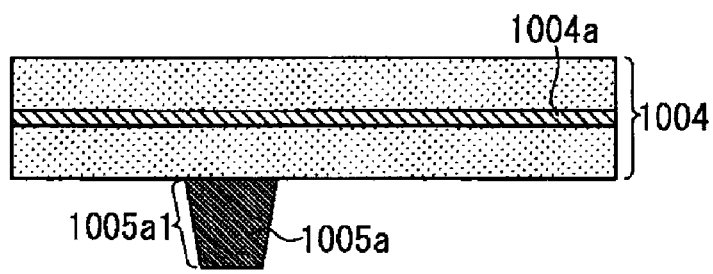

As shown in FIG. 8D, wet etching using a chemical solution is performed by using the resist mask 1006 as a mask, so as to form the conductive bump 1005a having a predetermined truncated cone pattern. The conductive bump 1005a is formed to have a tapered side part 1005a1 which is progressively smaller in diameter (dimension) toward the end part. The height of the conductive bump 1005a is about 50 µm. The diameter of the conductive bump 1005a at the end part and the diameter at the base are about 80 µmϕ and 100 µmϕ, respectively. The resist mask 1006 is then removed. In the steps described above, it is ensured that the insulating layer 1004 is not heated to a thermosetting temperature in order not to completely thermoset the layer 1004. The layer 1004 is maintained in a partially hardened state (fluid state).

A composite of the insulating layer 1004 and the conductive bump 1005a thus manufactured is used in the process described below of manufacturing the semiconductor module according to the first exemplary embodiment.

Figure 9A:
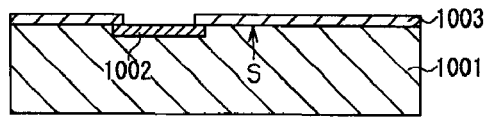
FIGS. 9A-9E are schematic sections illustrating a process of manufacturing a packaging board and a semiconductor module according to the first exemplary embodiment.

As shown in FIG. 9A, a well-known technology is used to form a semiconductor device (not shown) on the upper surface S of the semiconductor substrate 1001 embodied by, for example, a p-type silicon substrate, and to form the electrode 1002 around or above the semiconductor device. Generally, a metal such as aluminum is used to form the electrode 1002. An insulating protective film 1003 for protecting the semiconductor substrate 1001 is formed on at least a part of the surface S of the semiconductor substrate 1001 so as to expose a certain region of the electrode 1002. The protective film 1003 may comprise, for example, a silicon oxide ($SiO_2$) film or a silicon nitride (SiN) film.

Figure 9B:
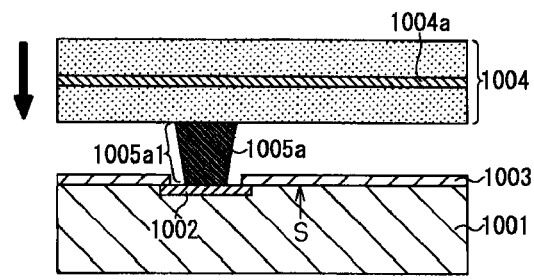

As shown in FIG. 9B, the end part of the conductive bump 1005a is brought into contact with the surface of the electrode 1002 of the semiconductor substrate 1001. The composite of the conductive bump 1005a and the insulating layer 1004 is formed as described above.

Figure 9C:
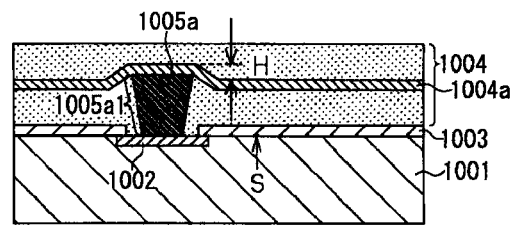

As shown in FIG. 9C, the semiconductor substrate 1001, the conductive bump 1005a and the insulating layer 1004 are integrated by pressure molding the assembly as described above using a press machine (press-fitting step). The pressure and the temperature of the press work are about 5 MPa and 200° C., respectively. The press work lowers the viscosity of the insulating layer 1004 so that the insulating layer 1004 undergoes plastic flow. This results in the conductive bump 1005a embedding itself in the insulating layer 1004, maintaining contact with the electrode 1002. Since the thickness of the insulating layer 1004 located on one side of the glass fiber 1004a is about 40 µm, and the height of the conductive bump 1005a is about 50 µm, the conductive bump 1005a is pressed against the glass fiber 1004a in the insulating layer 1004 in the process of pressure molding, deforming the glass fiber 1004a into a convex shape. With this, the glass fiber 1004a is formed into a convex shape above the conductive bump 1005a. The height (H) of the convex part is about 10 µm.

Subsequently, the insulating layer 1004 is completely hardened by subjecting the insulating layer 1004 to heat treatment (150° C., 30 minutes) (hardening step). As a result, the insulating layer 1004 is pressure-bonded to the semiconductor substrate 1001, and the conductive bump 1005a is anchored in the insulating layer 1004, maintaining contact with the electrode 1002. The glass fiber 1004a in the insulating layer 1004 is formed to cover the upper surface (the surface in contact with the via contact 1008b) of the conductive bump 1005a.

Figure 9D:
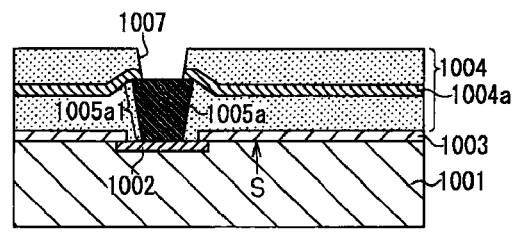

As shown in FIG. 9D, the aperture 1007 is formed so as to expose the conductive bump 1005a by irradiating the insulating layer 1004 from above. For laser irradiation, $CO_2$ gas laser may be employed. Irradiation is performed in a first condition and then in a second condition in which the pulse width is modified. A laser with a pulse period of 0.25 ms and an output of 1.0 W is used. The first condition may be such that the pulse width is 8-10 µs and the number of shots is 1. The second condition may be such that the pulse width is 3-5 µs, the pulse interval is 25 ms or longer, and the number of shots is 3. By irradiation, the aperture 1007 having a tapered side wall with a progressively smaller diameter toward the conductive bump 1005a and away from the surface of the insulating layer 1004 is formed. In this process, the aperture 1007 is formed to penetrate the glass fiber 1004a in the insulating layer 1004.

Figure 9E:
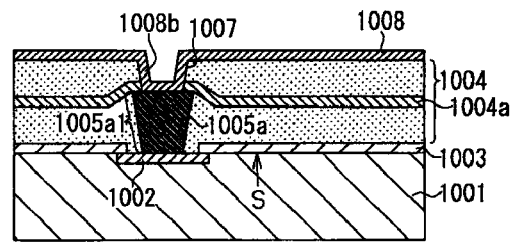

As shown in FIG. 9E, the upper surface of the insulating layer 1004 and the interior surface of the aperture 1007 are plated with copper by electroless plating and electroplating to a thickness of about 20 µm. As a result, a copper plating layer 1008 having a thickness of about 20 µm is formed on the insulating layer 1004, and the via contact 1008b is formed to coat the interior wall of the aperture 1007. By forming the aperture 1007 such that the glass fiber 1004a exposed on the interior surface of the aperture 1007, closeness of contact with the copper plating 1008 in the aperture 1007 is enhanced.

Finally, lithography and etching are performed as normally so as to work the copper plating layer 1008 into the rewiring pattern 1008a of FIG. 1 with lines and spaces. The solder resist layer 1010 is formed so as to cover the rewiring pattern 1008a and the insulating layer 1004 on the semiconductor substrate 1001, and to have an opening where an electrode pad for the rewiring pattern 1008a is formed. The solder resist layer 1010 functions as a protective film for the rewiring pattern 1008a. The solder resist layer 1010 comprises epoxy resin and has a thickness of about 40 µm. Solder printing is used to form an electrode for external connection (solder ball) 1009 which functions as a terminal for the rewiring pattern 1008a exposed through the opening of the solder resist layer 1010.

Through these steps, the packaging board and the semiconductor module of FIG. 7 according to the first exemplary embodiment is manufactured.

According to the packaging board, the semiconductor module of the first embodiment, and the method of manufacturing the same, the following advantages are provided.

(8) A packaging board and a semiconductor module are provided in which the likelihood of disconnection at the interface between the electrode 1002 and the via contact part (particularly, the conductive bump 1005a) due to temperature change is reduced, and the reliability of connection (thermal reliability) between the electrode 1002 and the via contact part is improved. This is due to the fact that, by providing the glass fiber 1004a on the upper surface of the conductive bump 1005a constituting the via contact part, the glass fiber 1004a operates to restrict the movement of the conductive bump 1005a even when the via contact part is stressed in the direction of peeling (vertical direction) so that the likelihood of peeling at the interface with the electrode 1002 is reduced. With this, peeling does not occur between the electrode 1002 and the conductive bump 1005a even when a temperature change occurs in the semiconductor module, so that bad connection between the electrode 1002 and the via contact part can be prevented.

(9) By forming the glass fiber 1004a into a convex shape above the via contact part (the conductive bump 1005a) so as to project toward the rewiring pattern 1008a with reference to the surrounding area, the glass fiber 1004a operates to prevent the displacement of the conductive bump 1005a when shear stress is developed between the electrode 1002 and the via contact part (particularly, the conductive bump 1005a). Accordingly, the reliability of connection between the electrode 1002 and the via contact part is further improved.

(10) By forming the glass fiber 1004a into a convex shape above the via contact part (the conductive bump 1005a) so as to project toward the rewiring pattern 1008a with reference to the surrounding area, the restoring force of the glass fiber 1004a formed into a convex shape (force whereby the glass fiber 1004a will drop the convex shape and return to the same level as the surrounding area) is exerted on the upper surface (the surface in contact with the via contact 1008b) of the conductive bump 1005a constituting the via contact part. Accordingly, the conductive bump 1005a is secured on the electrode 1002 successfully.

(11) By allowing the glass fiber 1004a in the insulating layer 1004 to restrict the vertical movement of the conductive bump 1005a on the electrode 1002, the reliability of connection (thermal reliability) between electrodes (between the electrode 1002 and the via contact part) in a semiconductor module is improved without interposing any adhesive layer such as a soft metal coating (e.g., a metal film) or a conductive adhesive (e.g., solder paste).

(12) According to the inventive method, in the process of pressure-bonding the insulating layer 1004 to the semiconductor substrate 1001, the packaging board, in which the glass fiber 1004a is provided on the upper surface (the surface in contact with the via contact 1008b) of the conductive bump 1005a, is automatically formed by allowing the conductive bump 1005a to embed itself in the insulating layer 1004. Accordingly, the steps of manufacturing the packaging board are simplified. Therefore, a packaging board with improved connection reliability (reliability of connection between the electrode 1002 and the conductive bump 1005a) in the presence of thermal stress can be manufactured at a reduced cost.

(13) By forming the glass fiber 1004a into a convex shape above the conductive bump 1005a so as to project toward the rewiring pattern 1008a with reference to the surrounding area, the restoring force of the glass fiber 1004a formed into a convex shape (force whereby the glass fiber 1004a will drop the convex shape and return to the same level as the surrounding area) is exerted on the upper surface (the surface in contact with the via contact 1008b) of the conductive bump 1005a. Accordingly, a semiconductor module in which the conductive bump 1005a is secured on the electrode 1002 successfully can be manufactured. In the process of pressure-bonding the insulating layer 1004 to the semiconductor substrate 1001, the semiconductor module is automatically formed by allowing the conductive bump 1005a to embed itself in the insulating layer 1004. Accordingly, the steps of manufacturing the semiconductor module are simplified.

(14) By forming the conductive bump 1005a on the electrode 1002 and then working the aperture 1007 by laser irradiation so as to form the via contact 1008b inside, the charge-up damage caused by dry etching is prevented from being applied to the semiconductor substrate 1001 via the electrode 1002, as compared with a case where the aperture 1007 is formed by dry etching. Accordingly, the reliability of the semiconductor module is prevented from being lowered. Further, given the same depth of the via contact part, time required to form the aperture 1007 by laser irradiation is reduced by interposing the conductive bump 1005a underneath the via contact 1008b. Therefore, adverse effects from heat caused by laser irradiation (damage by heat to the semiconductor device and associated lowering of the reliability of the semiconductor device) are mitigated. Consequently, high stability of manufacturing the semiconductor module, having the via contact part (the conductive bump 1005a and the via contact 1008b) connected to the electrode 1002, is ensured.

(15) By including the step of pressure-bonding the insulating layer 1004 to the semiconductor substrate 1001 while the insulating layer 1004 is not completely hardened, and the step of heating the insulating layer 1004 to harden the layer, the glass fiber 1004a can be easily formed on the upper surface (the surface in contact with the via contact 1008b) of the conductive bump 1005a, while allowing the conductive bump 1005a to embed itself in the insulating layer 1004. Therefore, the packaging board can be manufactured at a reduced cost.

(16) By embedding the conductive bump 1005a in the insulating layer 1004, maintaining contact with the electrode 1002, the insulating layer is no longer interposed between the electrode 1002 and the conductive bump 1005a, unlike a conventional arrangement where a metal plate projection penetrating the insulating layer is connected to the electrode and used as a via contact part. Accordingly, a semiconductor module, in which the reliability of connection between the conductive bump 1005a and the electrode 1002 is improved, can be manufactured in a stable manner.

(17) By forming the via contact 1008b on the conductive bump 1005a, the depth of the aperture is reduced as compared to a case where the via contact part is directly connected to the electrode 1002, given that the depth of the via contact part is the same. Therefore, time required for laser irradiation for forming the aperture (time to form the aperture) is reduced so that the throughput of packaging board manufacturing is improved.

(18) By forming the via contact 1008b on the conductive bump 1005a, the depth of the aperture is reduced as compared to a case where the via contact part is directly connected to the electrode 1002, given that the depth of the via contact part is the same. Therefore, the completeness of coating by the copper plating layer 1008 formed in the aperture (the via contact 1008b) is promoted, and the reliability of connection of the via contact part is improved.

(19) By forming the via contact 1008b on the conductive bump 1005a, the depth of the aperture is reduced as compared to a case where the via contact part is directly connected to the electrode 1002, given that the depth of the via contact part is the same. Therefore, the aspect ratio of the aperture is reduced. Therefore, variation in substrates manufactured caused by the depth of the aperture formed is reduced so that a packaging board with improved reliability can be manufactured easily without introducing any high-performance apparatuses for formation of an aperture. Additionally, the cost of manufacturing a packaging board is reduced.

(20) By forming the via contact 1008b on the conductive bump 1005a, the depth of the aperture is reduced as compared to a case where the via contact part is directly connected to the electrode 1002, given that the depth of the via contact part is the same. Given the same angle of tapering and the same bottom dimension (area) of the aperture as shown in FIG. 17 with a tapered side wall, growth of the dimension of the aperture due to the tapered form is less pronounced as the depth of the aperture is small. Thus, it is ensured that the dimension of the aperture toward the surface of the insulating layer 1004 is smaller than when forming an aperture that reaches the electrode 1002. Further, the conductive bump 1005a can be formed to a size smaller than the resolution limit in lithography, by over-etching the copper layer 1005. As a result of this, the size of a packaging board, having the via contact part with a laminate of the bump and the contact, is reduced.

(21) By embedding the conductive bump 1005a in the insulating layer 1004 by pressure-bonding, the conductive bump 1005a can be formed on the electrode 1002 such that the semiconductor substrate 1001 is not affected via the electrode 1002 by damage due to laser irradiation or dry etching than when forming a part corresponding to the conductive bump by laser irradiation or dry etching.

Second Exemplary Embodiment

Figure 10:
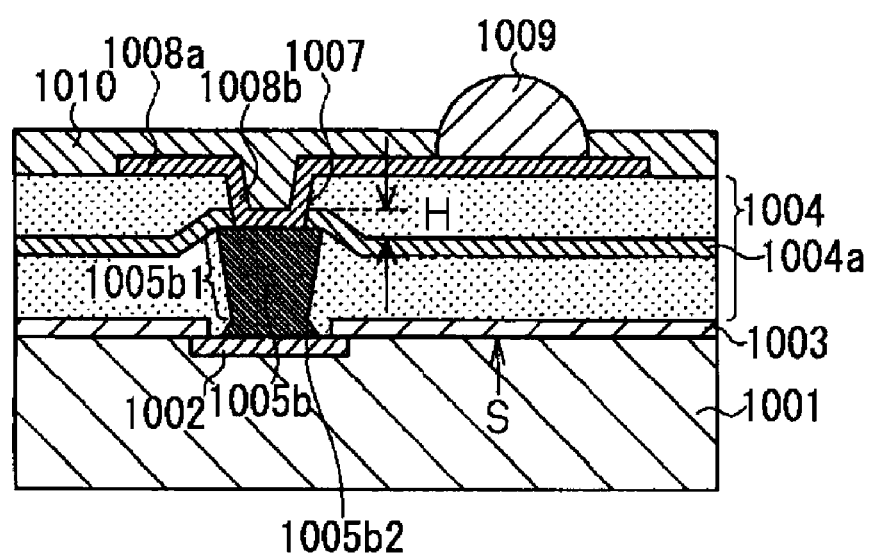
FIG. 10 is a schematic section showing the structure of a packaging board and a semiconductor module according to a second exemplary embodiment of this embodiment.

FIG. 10 is a schematic section showing a packaging board and a semiconductor module according to a second exemplary embodiment of this embodiment. A difference from the first exemplary embodiment resides in the configuration of a conductive bump 1005b after pressure-bonding. The end of the conductive bump 1005b collapses by pressure in the process of pressure-bonding, and is deformed to extend horizontally and uniformly along the surface of contact with the electrode 1002. As a result, the end of the conductive bump 1005b is formed into an inverted mesa structure. An inverted mesa structure is defined as a condition in which at least the diameter (dimension: particularly, the dimension at the surface of contact with the electrode 1002) at an end part 1005b2 is larger than the diameter (dimension) in the neighborhood of the end part 1005b2. The end part 1005b2 of the conductive bump 1005b may not be deformed uniformly and omnidirectionally (growing in circumference) along the contact surface. The deformation may be pronounced in one particular direction. Alternatively, the bump may be deformed in random directions presenting, for example, a star shape.

The conductive bump 1005b as described above with the end part 1005b2 can be easily manufactured by, for example, increasing the pressure applied to the bump in the pressure molding step of FIG. 9C using the press machine. The other aspects of the second exemplary embodiment are the same as the corresponding aspects of the structure and the manufacturing method described in the first exemplary embodiment.

According to the packaging board, the semiconductor module, and the method of manufacturing the same of the second exemplary embodiment, the following advantages are provided in addition to the advantages (7)-(21) of the first exemplary embodiment described above.

(22) By forming the end of the conductive bump 1005b (the part in contact with the electrode 1002) into an inverted mesa structure, the resultant anchor effect on the conductive bump 1005b further restricts the vertical movement of the via contact part, thereby improving the closeness of contact between the electrode 1002 and the via contact part. Thereby, the connection reliability (thermal reliability) of the semiconductor module in the presence of thermal stress is further improved.

(23) By deforming the end of the conductive bump 1005b when pressure-bonding the insulating layer 1004 to the semiconductor substrate 1001, a naturally oxidized film (not shown) formed on the surface of the conductive bump 1005b is disrupted so that non-oxidized copper (Cu) is exposed and connected to the electrode 1002. Thus, low resistance between the bump and the electrode can be achieved.

Third Exemplary Embodiment

Figure 11:
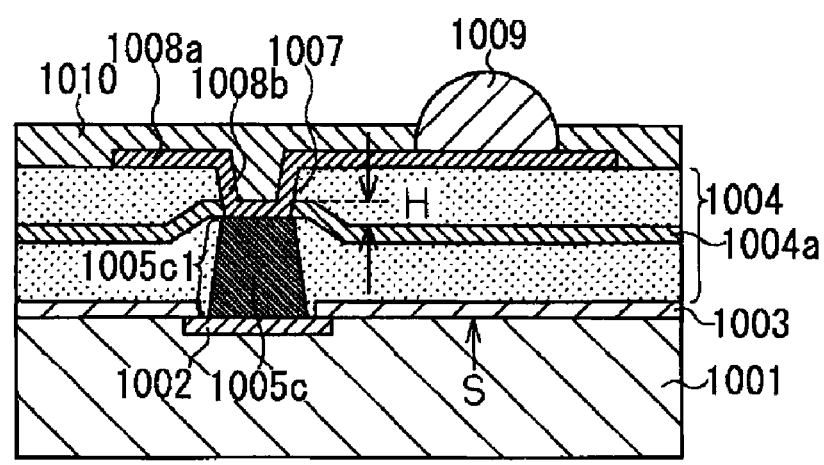
FIG. 11 is a schematic section showing the structure of a packaging board and a semiconductor module according to a third exemplary embodiment of this embodiment.

FIG. 11 is a schematic section showing the structure of a packaging board and a semiconductor module according to a third exemplary embodiment of this embodiment. A difference from the first exemplary embodiment is that a conductive bump 1005c is formed to have a side part 1005c1 which is progressively smaller in diameter (dimension) toward the via contact 1008b and away from the electrode 1002, i.e., the side part 1005c1 which is progressively larger in diameter (dimension) toward the electrode 1002 and away from the via contact 1008b. The other aspects of the third exemplary embodiment are the same as the corresponding aspects of the first exemplary embodiment.

Specifically, a metal such as copper is used to form the conductive bump 1005c. The conductive bump 1005c is positioned in association with the electrode 1002 and is embedded in the insulating layer 1004 while being in direct contact with the exposed surface of the electrode 1002. The glass fiber 1004a is formed to cover the upper surface (the surface in contact with the via contact 1008b) of the conductive bump 1005c. The height of the conductive bump 1005c is about 50 μm. The conductive bump 1005c is formed as an inverted truncated cone having an inverted trapezoidal cross section, and is provided with an end part parallel with the contact surface of the electrode 1002 of the semiconductor substrate 1001, and with a side part 1005c1 formed to be progressively smaller in diameter (dimension) toward the via contact 1008b and away from the end part. The diameter of the conductive bump 1005c at the end part and the diameter at the base are about 100 μmφ and 80 μmφ, respectively. Above the conductive bump 1005c, the glass fiber 1004a is deformed into a convex shape projecting toward the rewiring pattern 1008a with reference to the surrounding area. The height (H) of the convex shape is about 10 μm.

(Manufacturing Method)

FIGS. 12A-12E are schematic sections illustrating a method of forming an insulating layer provided with a conductive bump according to the third exemplary embodiment. FIGS. 13A-13B are schematic sections illustrating a process of manufacturing a packaging board and a semiconductor module according to the third exemplary embodiment.

Figure 12A:
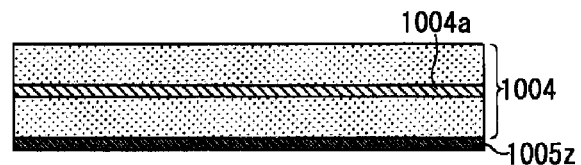
FIGS. 12A-12E are schematic sections illustrating a method of forming an insulating layer provided with a conductive bump according to the third exemplary embodiment.
Figure 13A:
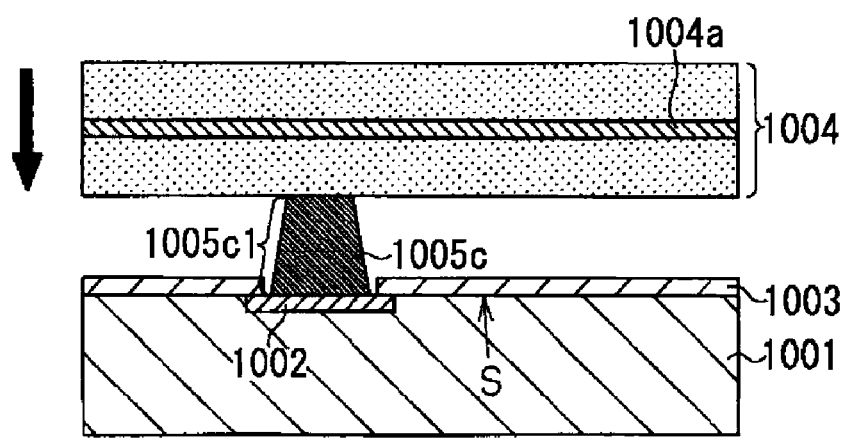
FIGS. 13A-13B are schematic sections illustrating a process of manufacturing a packaging board and a semiconductor module according to the third exemplary embodiment.
Figure 13B:
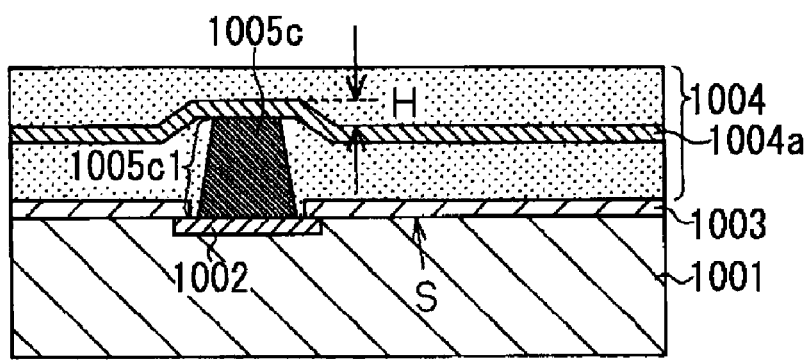

As shown in FIG. 12A, a copper foil 1005z having a thickness of about 3 μm is formed on the insulating layer 1004 which includes the glass fiber 1004a having a thickness of about 20 μm, comprises epoxy thermosetting resin, and has a thickness of about 100 μm.

Figure 12B:
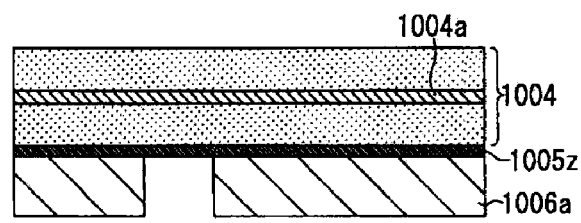

As shown in FIG. 12B, ordinary lithographic steps are employed to form a resist mask 1006a where the conductive bump is formed on the copper foil 1005z. The conductive bump is formed in association with the position of the electrode 1002 of the semiconductor substrate 1001 shown in FIG. 11.

Figure 12C:
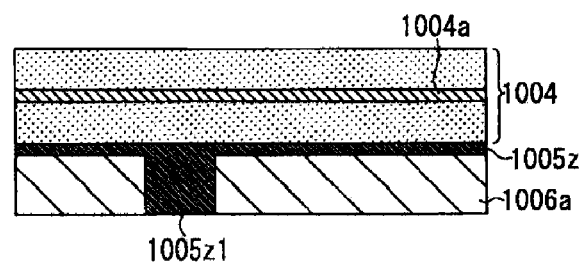

As shown in FIG. 12C, the surface of the copper foil 1005z exposed through the aperture of the resist mask 1006a is plated with copper by electroplating. With this, a copper plating layer 1005z1 having a thickness of about 50 μm is formed on the insulating layer 1004.

Figure 12D:
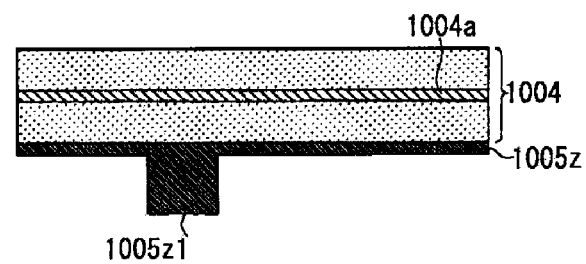

As shown in FIG. 12D, the resist mask 1006a is removed. With this, the copper plating layer 1005z1 serving as the conductive bump is formed on the copper foil 1005z.

Figure 12E:
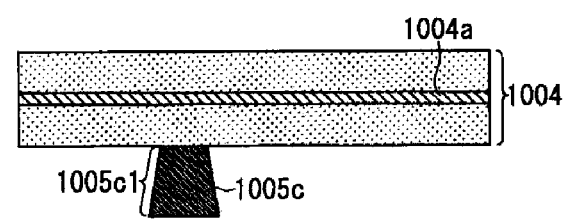

As shown in FIG. 12E, blanket etch-back is performed using a chemical solution so as to remove the copper foil 1005z outside an area where the conductive bump is formed (outside the copper plating layer 1005z1). In this process, the conductive bump 1005c is formed to have a tapered side part 1005c1 which is progressively smaller in diameter (dimension) toward a portion contiguous with the insulating layer 1004. The height of the conductive bump 1005c is about 50 μm. The diameter of the conductive bump 1005c at the end part and the diameter at the base are about 100 μmφ and 80 μmφ, respectively. In the steps described above, it is ensured that the insulating layer 1004 is not heated to a thermosetting temperature in order not to completely thermoset the layer 1004. The layer 1004 is maintained in a partially hardened state (fluid state).

A composite of the insulating layer 1004 and the conductive bump 1005c thus manufactured is used in the process described below of manufacturing the packaging board and the semiconductor module according to the third exemplary embodiment.

As shown in FIG. 13A, the semiconductor substrate 1001 provided with the electrode 1002 on its surface is prepared, and the insulating layer 1004 with the conductive bump 1005c is placed on the electrode 1002 so that the end part of the conductive bump 1005c is brought into contact with the electrode 1002. The composite of the conductive bump 1005c and the insulating layer 1004 is formed as described above.

As shown in FIG. 13B, the semiconductor substrate 1001, the conductive bump 1005c and the insulating layer 1004 are integrated by pressure molding the assembly as described above using a press machine. The pressure and the temperature of the press work are as described in the first exemplary embodiment. This results in the conductive bump 1005c embedding itself in the insulating layer 1004, maintaining contact with the electrode 1002. Since the conductive bump 1005c has the side part 1005c1 formed to be progressively smaller in diameter (dimension) toward a portion contiguous with the insulating layer 1004, the conductive bump 1005c can be smoothly embedded in the insulating layer 1004 in the process of pressure-bonding. Since the thickness of the insulating layer 1004 located on one side of the glass fiber 1004a is about 40 μm, and the height of the conductive bump 1005c is about 50 μm, the conductive bump 1005c is pressed against the glass fiber 1004a in the insulating layer 1004 in the process of pressure molding, deforming the glass fiber 1004a into a convex shape. With this, the glass fiber 1004a is selectively formed into a convex shape above the conductive bump 1005c. The height (H) of the convex part is about 10 μm.

Subsequently, the insulating layer 1004 is completely hardened by subjecting the insulating layer 1004 to heat treatment (150° C., 30 minutes). As a result, the insulating layer 1004 is pressure-bonded to the semiconductor substrate 1001, and the conductive bump 1005c is anchored in the insulating layer 1004, maintaining contact with the electrode 1002. The glass fiber 1004a in the insulating layer 1004 is formed to cover the upper surface (the surface in contact with the via contact 1008b) of the conductive bump 1005c.

The packaging board and the semiconductor module according to the third exemplary embodiment are manufactured through the steps described with reference to FIGS. 9D, 9E and 7 referred to in the first exemplary embodiment.

According to the packaging board, the semiconductor module, and the method of manufacturing the same of the third exemplary embodiment, the following advantages are provided in addition to the advantages (7)-(21) described above.

(24) Since the conductive bump 1005c is formed to have the tapered side part 1005c1 which is progressively smaller in diameter (dimension) toward a portion contiguous with the insulating layer 1004, the conductive bump 1005c can be smoothly embedded in the insulating layer 1004 in the process of embedding the conductive bump 1005c in the insulating layer 1004, maintaining contact with the electrode 1002. This results in increased manufacturing throughput and cost reduction of packaging boards with improved manufacturing stability (reliability).

(25) Since the conductive bump 1005c is formed to have the tapered side part 1005c1 which is progressively smaller in diameter (dimension) toward a portion contiguous with the insulating layer 1004, the pressure exerted from outside on the conductive bump 1005c can be concentrated in a portion pressed against the glass fiber 1004a, in the process of causing the conductive bump 1005c to deform the glass fiber 1004a in the insulating layer 1004 into a convex shape. Accordingly, the conductive bump 1005c can deform the glass fiber 1004a effectively and efficiently. As a result, the throughput in manufacturing the packaging board can be improved.

Fourth Embodiment

A description will now be given of a mobile device provided with the semiconductor module of a fourth embodiment. While a cell phone is described to exemplify mobile devices, the inventive module may also be applied to electronic devices such as personal digital assistants (PDA), digital video cameras (DVC) and digital still cameras (DSC).

Figure 14:
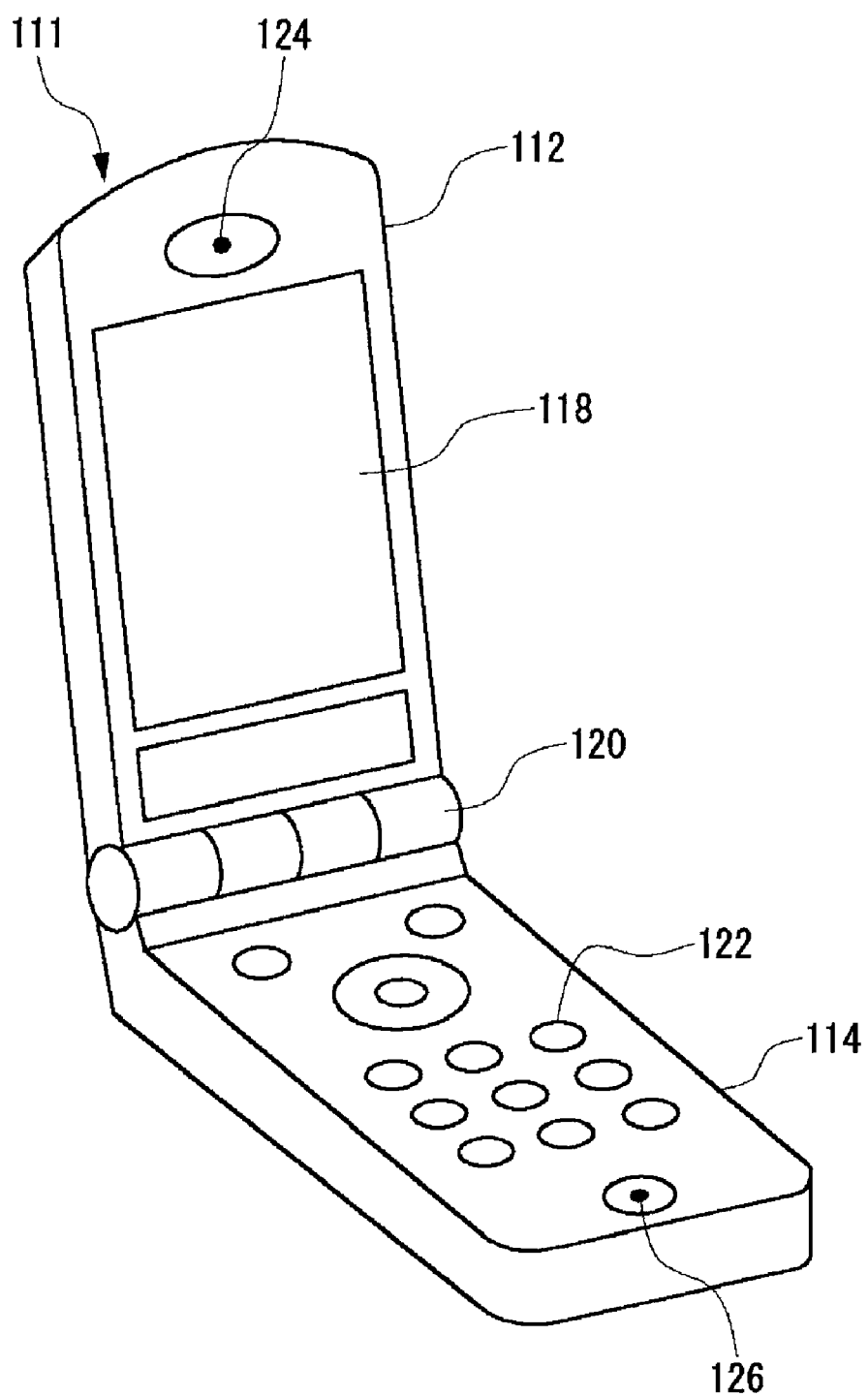
FIG. 14 shows the structure of a cell phone according to the fourth embodiment provided with the semiconductor module.

FIG. 14 shows the structure of a cell phone of the fourth embodiment of the present invention provided with the semiconductor module. A cell phone 111 is structured such that a first housing 112 and a second housing 114 are connected via a movable part 120. The first housing 112 and the second housing 114 are movable around the movable part 120. The first housing 112 is provided with a display unit 118 for displaying information including characters and images, and with a speaker unit 124. The second housing 114 is provided with a control 122 (e.g. control buttons) and a microphone unit 126. The semiconductor module according to the embodiments is mounted inside the cell phone 111.

Figure 15:
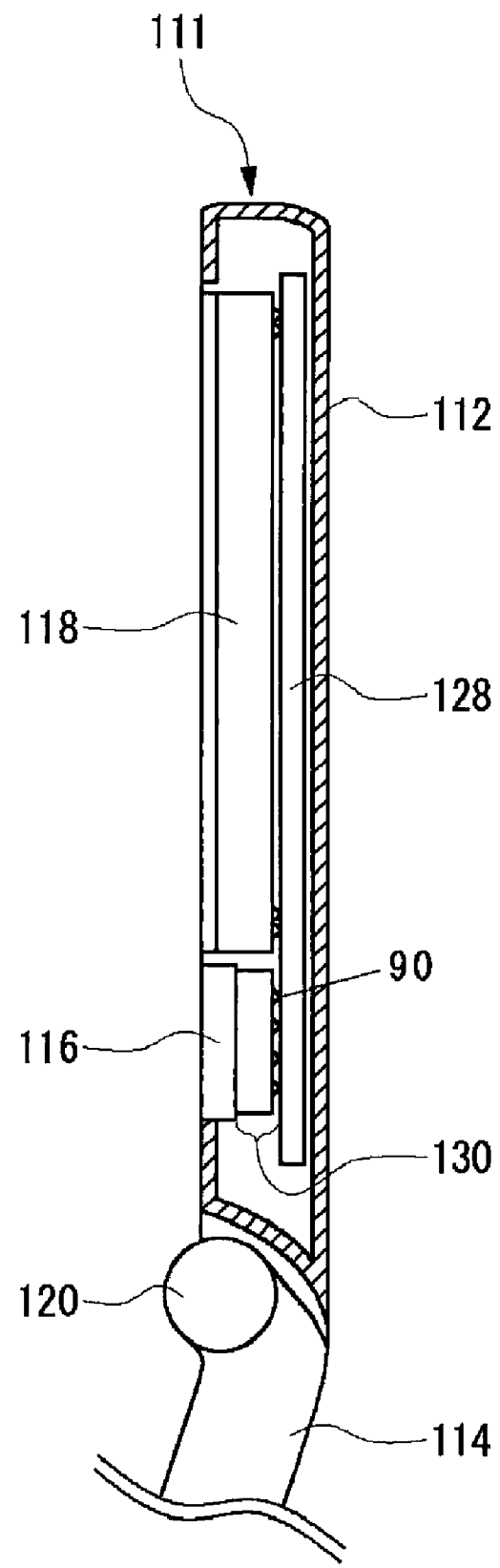
FIG. 15 is a partial section of the cell phone shown in FIG. 14 (section of the first housing).

FIG. 15 is a partial section of the cell phone shown in FIG. 14 (section of the first housing 112). The semiconductor module 130 according to the embodiments is mounted on a printed board 128 via an electrode 90 for external connection, and electrically connected to, for example, the display unit 118 via the printed board 128. The underside of the semiconductor module 130 (the surface opposite to the electrode 90) is provided with a heat spreader 116 such as a metal plate. For example, heat generated by the semiconductor module 130 is prevented from collected inside the first housing 112 and is released outside the first housing 112 efficiently.

According to the mobile device of the fourth embodiment provided with the semiconductor module, the following advantages are provided.

(26) Since the connection reliability of the semiconductor module 130 is improved, the reliability of the mobile device carrying the semiconductor module 130 is improved.

(27) Since the cost of manufacturing the semiconductor module 130 is reduced, the cost of manufacturing the mobile device carrying the semiconductor module 130 is reduced accordingly.

(28) Since the semiconductor module 130 manufactured by the method described in the embodiments is slim and small, the mobile device carrying the semiconductor module 130 may be slim and small.

In the exemplary embodiments, provision of the via contact part (the conductive bumps 1005a-1005c and the via contact 1008b), which connects the electrode 1002 of the semiconductor substrate 1001 and the rewiring pattern 1008a, is described by way of example. Alternatively, the embodiment may be applied to a via contact connecting the lower interconnect and the upper interconnect in a multi-layer board. With this, the connection reliability and manufacturing stability of the multi-layer board can be improved and the multi-layer board can be manufactured and provided at a reduced cost.

In the exemplary embodiments, the electrode 1002 and the conductive bumps 1005a-1005c are formed of different metals (aluminum and copper) by way of example. Alternatively, the electrode and the bump may be formed of the same metal (e.g. copper). In this case, since the electrode 1002 and the conductive bumps 1005a-1005c have the same coefficient of thermal expansion, the connection reliability of the semiconductor module in the presence of heat (thermal reliability) is further improved.

In the embodiments, the via contact 1008b is provided to coat the aperture 1007. Alternatively, the via contact 1008b may be formed so as to completely fill the aperture 1007 with copper plating, by ensuring that the aperture size of the aperture 1007 is small, and an inhibitor and an accelerator are added in the plating solution while forming the routing patter 1008a, which includes the via contact 1008b. In this case, the resistance of the via contact can be lowered.

In the exemplary embodiments, the conductive bumps 1005a-1005c having a truncated cone shape with a trapezoidal cross section and having the tapered side parts 1005a1-1005c1, respectively, are employed by way of example. Alternatively, cylindrical conductive bumps having a certain diameter may be used. While the round conductive bump with a truncated cone shape is used in the embodiment, the bump may have a polygonal (e.g. square) shape. The aforementioned advantages are equally enjoyed with such a configuration.

In the exemplary embodiments, the conductive bumps 1005a-1005c having the side parts 1005a1-1005c1, respectively, and having a trapezoidal cross section are given by way of example. Alternatively, the end part of a square-shaped conductive bump may be chamfered so that only a part of the side part is tapered. Similarly, only the end part may be rounded. The aforementioned advantages are equally enjoyed with such a configuration.

In the exemplary embodiments, the glass fiber 1004a is formed into a convex shape above the via contact part (the conductive bumps 1005a-1005c) so as to project toward the rewiring pattern 1008a with reference to the surrounding area. Alternatively, the position of the glass fiber 1004a in the insulating layer 1004 may be adjusted so that the bottom of the glass fiber 1004a is substantially flush with the upper surface (the surface in contact with the via contact 1008b) of the conductive bumps 1005a-1005c, so that the glass fiber 1004a is formed to be flat. The aforementioned advantages other than (2), (3) and (6) are enjoyed with such a configuration.

In the exemplary embodiments, the conductive bumps 1005a-1005c are provided so as to be directly in contact with the electrode 1002. Alternatively, an adhesive layer such as a soft metal coat (e.g., a gold coat) or a conductive adhesive (e.g., solder paste) may be interposed as in the related art. In this case, the glass fiber 1004a in the insulating layer 1004 restricts the vertical movement of the conductive bump 1005a, and at least the connection reliability between the adhesive layer and the via contact part (the conductive bumps 1005a-1005c) can be improved.

In the exemplary embodiments, $CO_2$ laser is employed. Alternatively, UV laser or YAG laser may be employed.

In the second exemplary embodiment, the end of the conductive bump 1005b is formed into an inverted mesa structure. Alternatively, a portion of the conductive bump may be meshed with the electrode 1002 without deforming the end of the conductive bump. In this way, the area of contact between the electrode 1002 and the conductive bump is increased so that the closeness of contact is improved. Therefore, the reliability of connection between the electrode 1002 and the conductive bump is enhanced. Further, in the event that shear stress is developed between the electrode 1002 and the via contact part (particularly, the conductive bump), the conductive bump meshed with the electrode 1002 prevents the displacement between the electrode and the via contact part. Accordingly, the reliability of connection between the electrode 1002 and the via contact part is further improved.

In the second exemplary embodiment, the end of the conductive bump 1005b is deformed in the opening of the protective film 1003 by way of example. Alternatively, the end of the conductive bump may be deformed so as to cover the protective film 1003 outside the opening. In this case, it is ensured that the contact area of the conductive bump matches the area of the opening of the protective film 1003 (the area through which the electrode 1002 is exposed). Therefore, difference in resistance between the electrode 1002 and the conductive bump can be reduced. Consequently, high stability in manufacturing the semiconductor module, having the via contact part (the conductive bump 1005b and the via contact 1008b) connected to the electrode 1002, is ensured.

These embodiments are intended to be illustrative only and it will be obvious to those skilled in the art that various modifications could be developed based on the knowledge of a skilled person and that such modifications are also within the scope of the present invention.

What is claimed is:

1. A packaging board comprising:
    a first wiring layer;
    an insulating layer on the first wiring layer and containing a fibrous filler inside;
    a second wiring layer on the insulating layer; and
    a via conductor penetrating the insulating layer and electrically connecting the first wiring layer and the second wiring layer, wherein the via conductor is provided with a first conductor part provided to be in contact with the first wiring layer and a second conductor part provided on the first conductor part, and the fibrous filler is located on a surface of the first conductor part on which the second conductor part is provided, and wherein, above the via conductor, the fibrous filler is deformed into a convex shape projecting toward the second wiring layer with reference to the surrounding area.

2. The packaging board according to claim 1, wherein, the part of the first conductor part in contact with the first wiring layer is formed into an inverted mesa structure.

3. The packaging board according to claim 1, wherein, the part of the first conductor part in contact with the first wiring layer is formed into an inverted mesa structure.

4. A semiconductor module comprising: the packaging board of any one of claim 1, 2 or 3; and a semiconductor device mounted on the packaging board.

5. A mobile device comprising the semiconductor module of claim 4.

* * * * *